United States Patent [19]

Lawrence et al.

[11] Patent Number: 4,998,004
[45] Date of Patent: Mar. 5, 1991

[54] ELECTRON BEAM GUN

[75] Inventors: Glen S. Lawrence, Naperville; Timothy J. Haynie, Hickory Hills; Joseph D. Farrario, LaGrange, all of Ill.

[73] Assignee: Ferranti Sciaky, Inc., Chicago, Ill.

[21] Appl. No.: 386,222

[22] Filed: Jul. 28, 1989

[51] Int. Cl.⁵ .............................................. B23K 15/00
[52] U.S. Cl. .......................... 219/121.13; 219/121.12; 219/121.33; 219/121.34
[58] Field of Search ...................... 219/121.12, 121.13, 219/121.14, 121.15, 121.16, 121.17, 121.18, 121.19, 121.20, 121.23, 121.27, 121.34, 121.35, 121.33

[56] References Cited

U.S. PATENT DOCUMENTS 4,687,902 8/1987 Colegrove et al. ............ 219/121.34

Primary Examiner—C. L. Albritton
Attorney, Agent, or Firm—Julius L. Solomon

[57] ABSTRACT

An improvement in high power electron beam guns including a non-inductive high-voltage cable for supplying power to the gun having barriers for preventing air leakage from inside the cable into the vacuum chamber. The gun includes a support for its cathode and filament, which transmits heat developed in these elements to a heat sink so that dimensional accuracy is maintained in the electron beam generating elements. Provision is made for quick release of cable terminations from the gun receptacle and for maintaining a given pressure in insulating grease placed between mating sufaces of plugs and receptacles.

6 Claims, 4 Drawing Sheets

ELECTRON BEAM GUN

This invention relates to electron beam welding machines utilized for welding abutting materials along their line of abutment and, more specifically, to electron beam guns for generating a high power electron beam in the kilowatt power range for use in welding materials along their abutting edges.

Electron beam guns mounted within a vacuum chamber upon carriages which are capable of moving the gun along two or three axes and designed to operate at a maximum of 60 kilovolts and capable of delivering 1 ampere of electron beam current have been utilized in the past.

The electron beam welding machines utilized in the past have suffered from several problems during their operation which result in downtime and lowered production. Among these deficiencies, which result in malfunctioning of the electron beam welders of the past, have been:

1. Short-circuiting of the electron beam gun due to the arc-over between those parts of the gun at a high potential and those parts at ground potential.
2. Arc-over and short-circuiting and burning out of the cables which carry the high-voltage power from a high-voltage power supply to the gun.
3. Difficulties experienced in the replacement of the filaments utilized in the electron beam gun.
4. Misalignment or shift of the electron beam during the life of the filament, resulting in the electron beam missing the seam to be welded and resulting in wasted production parts, which in certain cases mean a loss of several thousands of dollars.
5. Changes in the axial position of the filament with changes of temperature, causing change in focusing of the beam and in the size of beam where it strikes the work, and variations in total current supplied by the beam and in beam current density.
6. Excessively long pumpdown times to reach the required pressure of $10^{-4}$ torr or less in the vacuum chamber.

The present invention has for its purpose the reduction in the frequency of breakdown of the electron beam gun and associated elements of the welding machine so as to reduce the loss of production time.

It is an object of the present invention to provide an electron beam welding machine and components which will not be subject to the breakdowns and inconveniences and time loss mentioned above.

It is an object of the present invention to provide a reliable electron beam welding gun which is mobile within a vacuum chamber.

Another object is to provide an improved means for removing heat effectively from the electron gun so as to reduce changes due to expansion of critical elements in the gun.

It is a further object of this invention to provide an improved high-voltage cable for transmitting electric power from a high-voltage power source to the electron gun.

It is a further object of this invention to provide a high-voltage cable for use within a vacuum chamber which is capable of withstanding internal atmospheric pressure when the cable assembly is operated in a vacuum environment.

A further object of the invention is to provide a unique termination on the cables whereby the interior of the cable is protected from the vacuum when the cable is utilized within a vacuum chamber.

The high-voltage cables utilized in the past were constructed in such a manner that inductive coupling existed between the leads carrying filament current from an external power supply to an electron gun inside the chamber and the conductor carrying the high potential required for the anode of the gun and also the conductor which transmitted the bias potential to the control electrode of the electron gun. Any variations in voltage; for example, ripple in the high-voltage power supply or transients created on the power line, induced voltages in the bias circuit which exaggerated the current changes due to the ripple or the transients on the line. In order to suppress the induced variations in bias voltage, the bias circuit was heavily filtered, thus creating another difficulty; that is, an increase in the response time of the system, which resulted in limitations in the speed with which the electron beam current could be changed. This, of course, limited the number of applications to which the electron beam machine could be applied.

Another difficulty with the prior art electron beam machines was due to the fact that the inside of the cables could contribute, by outgassing, to the gas load of the vacuum chamber. Because of this continuous outgassing, long pumpdown times were required to bring the chamber down to the pressure required for electron beam welding. Furthermore, during the use of the electron beam machine, bursts of outgassing could increase the pressure in the vacuum chamber and at times cause arcouts and short-circuiting of the cable.

The new electron beam machine includes a means for preventing air from leaking from the inside of the cable to the inside of the vacuum chamber. This is accomplished through the use of novel terminations at each end of the cable which supplies the high-voltage and filament and bias voltages to the electron gun.

BRIEF DESCRIPTION OF DRAWINGS

The present invention, which overcomes the above inconveniences, is illustrated in the following figures, in which

FIG. 1 illustrates the essential elements of an electron beam gun made in accordance with the invention. The essential parts of the electron gun [1] are a cathode assembly [2]; an anode assembly [3]; a focusing coil [4]; a deflection coil [5]; means for supporting the cathode assembly [6], which includes terminals [36] and [37] for supplying the electrical power to the cathode assembly which mate with low insertion force connectors [7] which form a receptacle in the plug [8] of the cable assembly (FIG. 2) which connects to the source of power; a valve means [10] which may be closed off to prevent the passage of an atmosphere surrounding the gun from entering the area in which the cathode and anode elements are situated and means for opening and closing this valve [11]; a turbomolecular pump [13] for reducing and maintaining the pressure in this area to below $10^{-5}$ torr; and a gun body [14] for supporting the aforementioned elements of the gun. The cathode holder assembly [2] includes a large, cone-shaped ceramic cathode insulator [6] and outer metal housing [12] as well as the cathode electrode and filament and its associated holders and clamps. An outer metal housing [19] supports the cathode electrode [15] by nut [16]. A filament [17] is supported in close proximity to the cathode by cathode connectors and supports [18] along with its associated clamping devices. The cathode electrode [15] is insulated from the filament supports and conductors so that a potential between 0 and $-2,000$ volts may be applied to the cathode in order to control the electron beam current. The anode [3] which is supported and maintained in a central position to the cathode by the body of the gun is maintained at a potential of up to $+60,000$ volts, during the operation of the gun, by means of a suitable high-voltage power supply. The filament is connected to the negative terminal of the high-voltage power supply. Besides the high-voltage power supply for supplying the accelerating voltage for the electron gun, a bias power supply having an adjustable range from 0 to 2,000 volts is connected between the cathode and the filament for controlling the electron beam current by applying a negative potential to the cathode with respect to the filament.

A large, cone-shaped ceramic cathode insulator [6] supports the cathode parts and insulates the cathode from the ground and anode potential of 60,000 volts. The cathode insulator shape has been reduced to its simplest, most elemental form. The high-voltage stressed services are basic linear forms inasmuch as it has been determined that a linear surface is best for protection against high-voltage stresses in a vacuum environment. Both the inside and outside surfaces of the insulator are conical in shape. The two conic surfaces, however, are divergent so that the ceramic wall thickness or cross-sectional thickness of the insulator increases rapidly from the center outwardly so that the insulator acts as an excellent heat sink and heat conductor from the filament supports out to the gun housing. The ability of the cathode insulator to act as a thermal conductor is due to the unique shape of the insulator and the material, aluminum oxide, which has a high thermal conductivity in the order of 20 watts per meter per degree kelvin. This is a conductivity which is as good or better than some metals. Alternate materials such as beryllium oxide or silicon nitride may be used at some additional cost in material. The smaller end of the ceramic insulator extends into the cylindrical cathode (control electrode) holder, and the filament holders bolt directly onto the surface of the insulator so that heat from the filament holders may flow directly into the insulator. The outer large diameter of the ceramic insulator is bonded directly to the housing [12] by means of a high thermal conductivity epoxy [9]. The ceramic may also be mounted by brazing it to the housing [12] or mechanically clamping it. Means for cooling the cathode insulator [6] may be realized by machining the upper end of the insulator [22], as shown, so as to form a circumferential channel [23] between the insulator and the supporting gun body [14]. Water or other suitable liquid may be circulated through the channel [23] in order to remove heat from the top end of the insulator [6]. The insulator holder and support [12] and the insulator may also be cooled by means of a flange [20] formed at the top end of the gun body [14] in which a passageway [21] is formed through which water or other liquid may be circulated. The coolant flowing through passageway [21] would be effective in conducting heat away from the cathode insulator and also the anode and any heat that might possibly be developed in the focusing and deflection coils.

Figure 2:
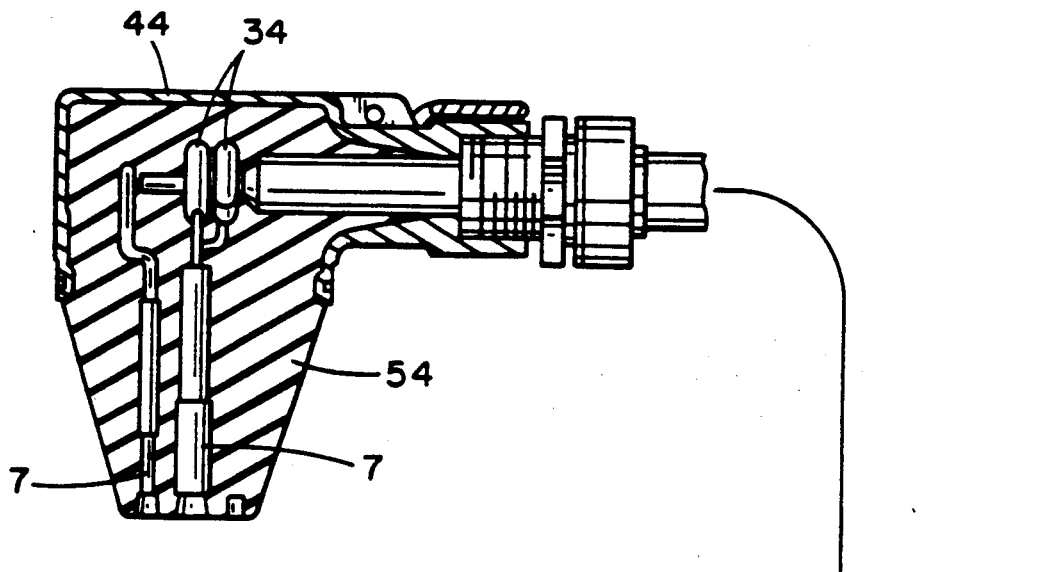
FIG. 2 illustrates the high-voltage cable assembly showing the plugs at each end of the cable in cross section.
Figure 2A:
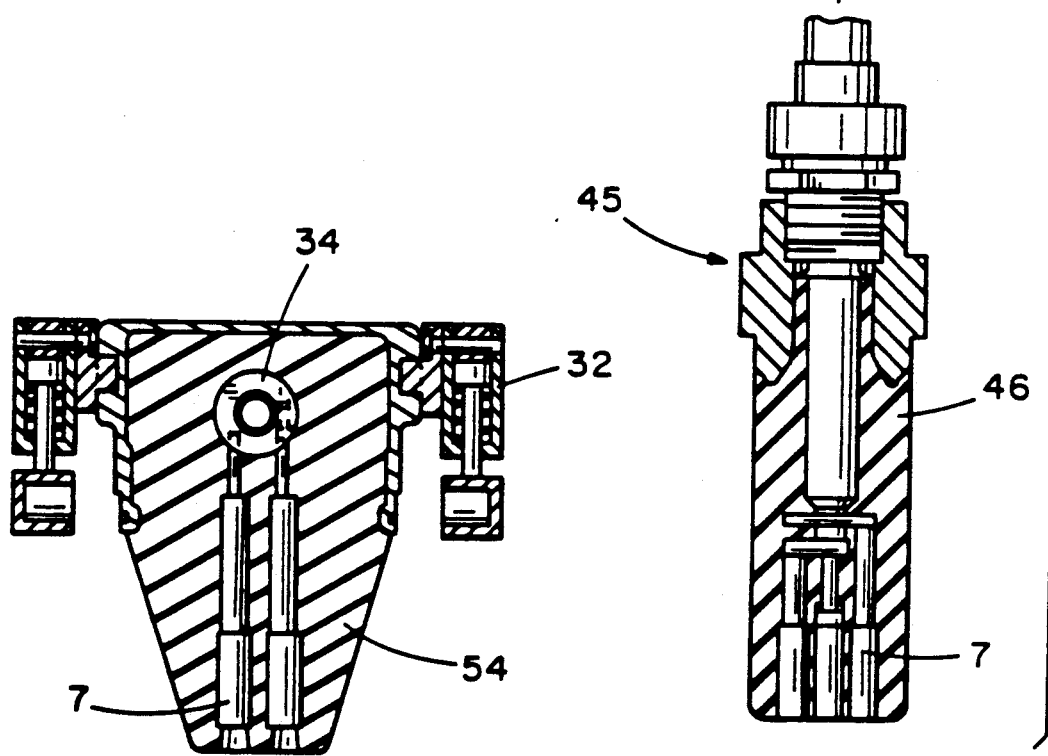
FIG. 2A is an end view in section of the gun plug cable termination.
Figure 3:
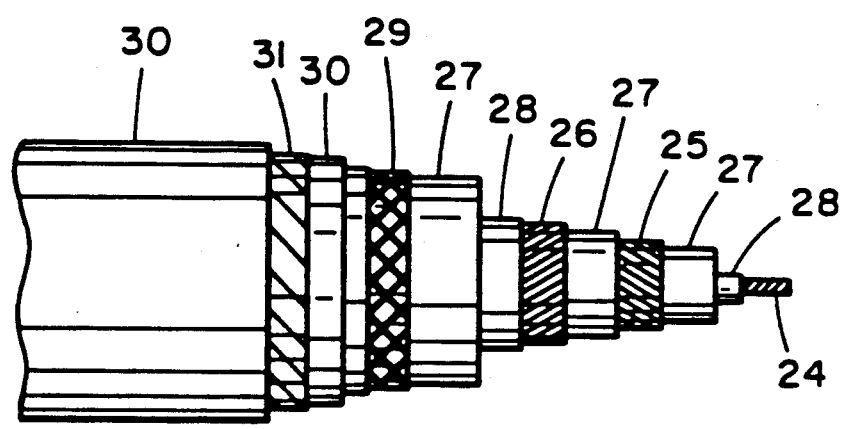
FIGS. 3 is a drawing showing the construction of the high-voltage cable in detail.

The construction of the cable assembly is illustrated in FIGS. 2 and 3.

Figure 1:
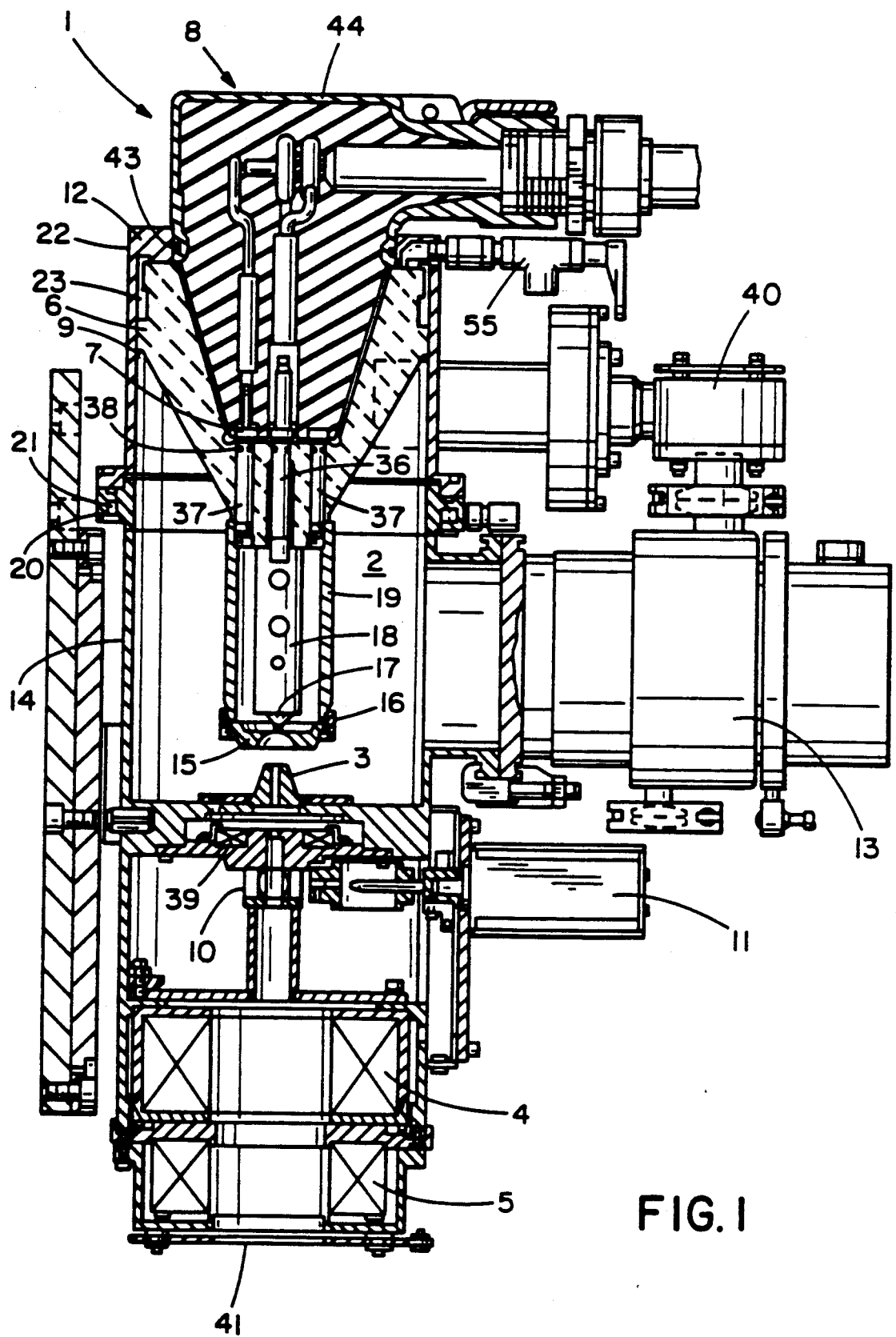
FIG. 1 is a cross section of the electron beam gun assembly.

From FIG. 3 can be seen that the cable has a triaxial core containing the bias voltage lead [24] in the center, surrounded by two concentric wire serves [25] and [26] for the two filament leads. These are the three required leads for the negative electrodes in the electron gun. The two filament leads carry heating current for the filaments and the center lead carries the control, or "bias", voltage for the large field-shaping cathode electrode, or control electrode, also known as the "grid" or "Wehnelt". The "cathode" electrode, or control electrode, and the filament are both at negative high-voltage potential. Thus the triaxial core of the high-voltage cable is at a high negative potential (nominally 60 kilovolts) for the electron gun shown in FIG. 1. The cable has extruded silicone high-voltage insulation [27] covering the triaxial core, suitably buffered with a semi-conductive layer [28] on the internal diameter. An outermost conducting braid [29] provides a grounded sheath and the entire cable is protected by a Hypalon jacket [30]. This jacket is especially reinforced with imbedded serves of Kevlar fiber [31]. The reinforced jacket is capable of withstanding internal atmospheric pressure when the cable assembly is operated in a vacuum environment.

Detailed construction of the cable proper is shown in FIG. 2. While the exterior of the cable is intended for vacuum operation, the interior of the cable is protected from the vacuum by both the reinforced jacket and the termination techniques used at the ends of the cable. The cable is terminated at both ends in a silicone potting material that functions as a seal and a good high-voltage dielectric material. At the gun end of the cable, the termination is potted into a mold so that the silicone potting material is formed into the desired external shape for the termination. The finished termination is a conical elastomer shaped to closely fit into the ceramic electron gun cathode support [6] and is arranged at a right angle to the cable.

Figure 2B:
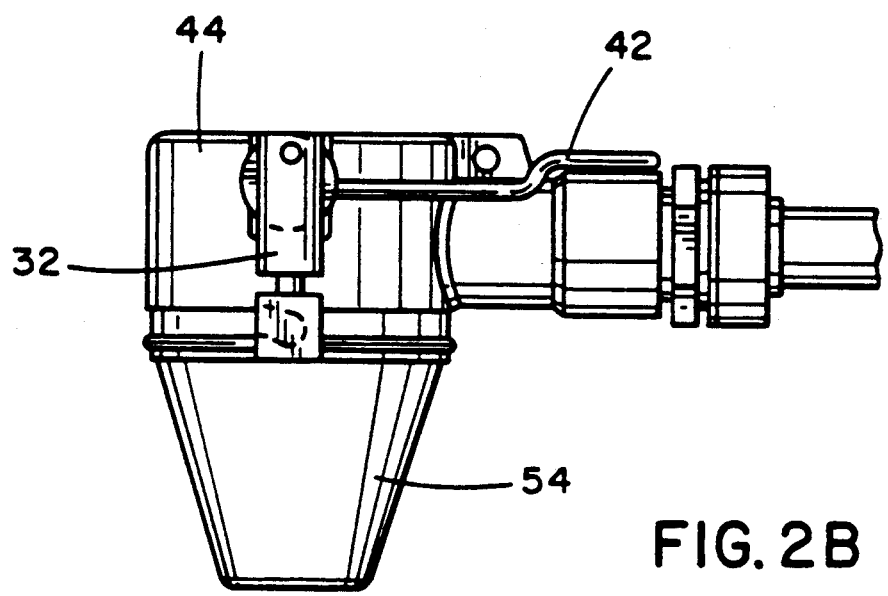
FIG. 2B is a side view of the gun plug.

The termination is housed in a one-piece cast housing [44] as in FIG. 2B, complete with a service lug [32] which can be used to support the cable end when it is removed from the electron gun.

Figure 4:
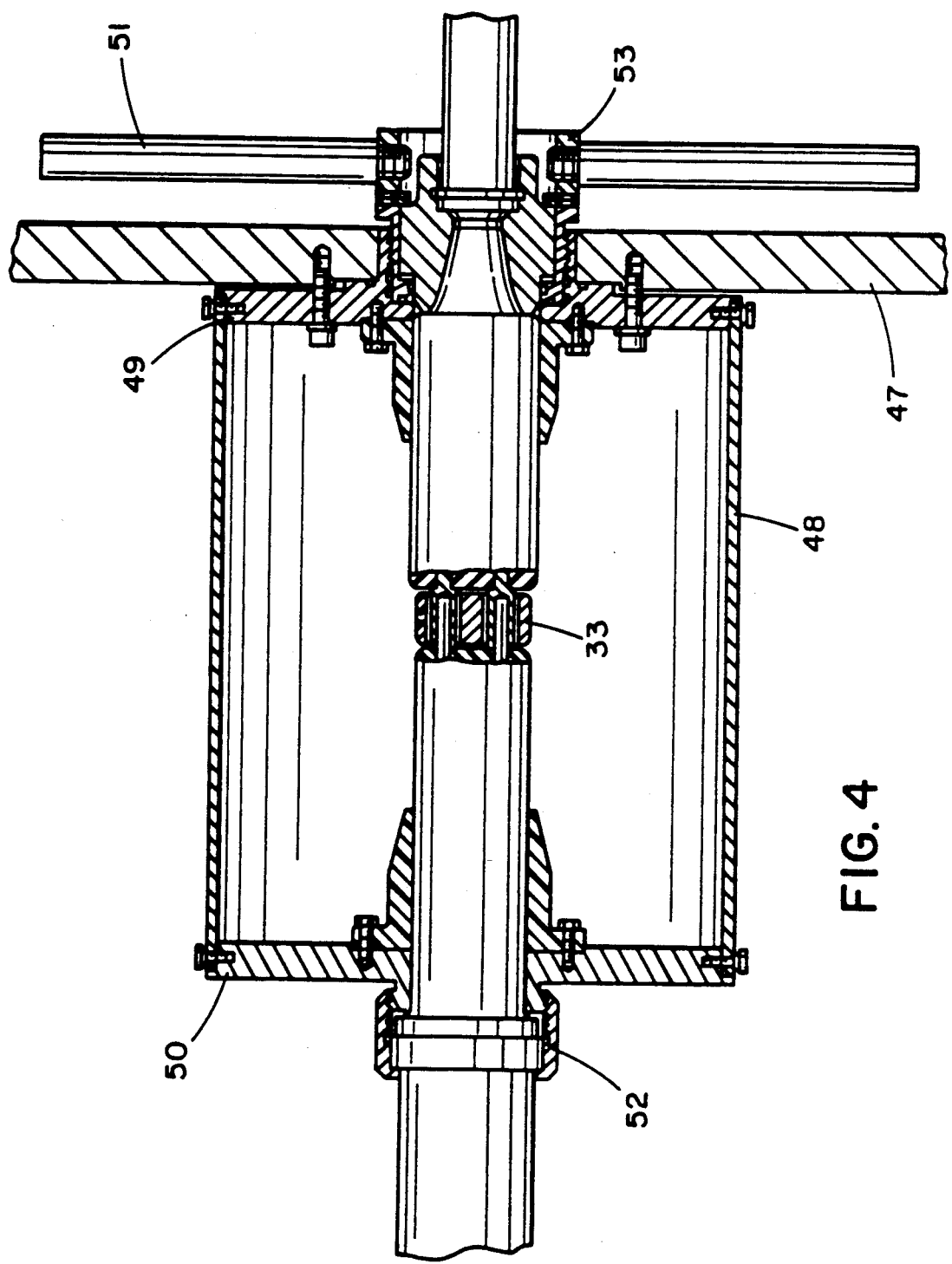
FIG. 4 is a cross-sectional drawing of the cable junction box to be mounted to the wall of the vacuum chamber of the electron beam welding machine.

At the opposite end of the cable, the termination [45] is potted, using the silicone potting material, into a precast epoxy [46] termination. This epoxy termination is used to connect the cable to the vacuum chamber wall feedthrough (that is, the high-voltage bushing that penetrates the vacuum vessel wall) as shown in FIG. 4. At each end, a modification of a standard cord grip is used to support the cable, and it is supplied with a rubber gland that seals on the jacket of the cable. A sleeve of stainless steel braid is pulled over the entire length of the cable to protect the jacket material from weld splatter, and the sleeve is terminated at the cord grips on a tubular metal ferrule with a clamp collar.

The connector [33] into which the cable terminations (plugs) fit are filled with a dielectric grease or silicone paste that is used to eliminate any voids in the interface between the cable plug and the connector. The connector [33] and the terminations from the cable inside the vacuum chamber, which connect to the electron gun, and the termination of the cable outside the chamber which connects to the power supply, are supported and housed within a cable junction box formed from cylinder [48] and end pieces [49] and [50]. End piece [49] is fastened to an outer wall [47] of the vacuum chamber.

The plug of the outside cable is introduced into the junction box and held in place by nut [52]. The plug of the cable inside the chamber is introduced into the junction box from inside the chamber and the two plugs connected by connector [33]. The plug is held in place by nut [53], to which handles [51] are attached. These handles are used to facilitate the positioning of the plugs. The other end of the inside cable is received by the cathode insulator. The silicone elastomer which forms the cable termination is cast to a shape which conforms to the interior of the ceramic insulator. The cable termination is forced into the ceramic cavity and any interference is eliminated by deformation of the elastomer and any gaps in the interface are filled with silicone dielectric grease, which is "buttered" onto the mating surfaces.

The cable is retained by two spring-loaded dogs [32] thrown by a single lever [42]. This permits quick connect and disconnect of the cable into the gun receptacle. The spring load controls the positive pressure in the grease-filled receptacle under the vacuum environment and under a changing temperature environment. The cable termination housing has an O-ring seal [43] which engages with the cathode holder assembly and seals the receptacle as the cable is plugged into it. A vent valve with pressure relief valve [55] allows venting of air and excess grease as the cable is being inserted while guaranteeing a positive pressure on the grease.

Additional features included on both end terminations of the cable include special corona ring style fittings [34] to terminate the filament conductor wire serves. The terminal rings are built as split clamps and can be tightened down to the wire serves which are supported above the underlying insulation by means of metal ferrules inserted under the serves. Once clamped in place, the leads may be easily soldered to the rings for maximum joint integrity. Low insertion force electrical conductors [7] are utilized at both ends of the cable to permit easy insertion and removal of the cable termination.

The cathode holder assembly includes the large cone-shaped ceramic cathode insulator and outer metal housing as well as the cathode electrode, filament and associated holders, clamps, etc. The cathode insulator and housing have several new and unique features.

The cathode insulator shape has been reduced to its simplest, most elemental form. The high-voltage stressed surfaces are basic linear forms, since it has been found that a linear surface is best in vacuum for high-voltage stress. The exterior surface of the insulator and the interior surface of the insulator are conical. The interior stressed surface is a cone and forms a cable receptacle matching the termination contour exactly. The two conic surfaces are divergent so that the ceramic wall thickness or cross-sectional thickness increases rapidly. The increasing wall cross-section allows the heat which is developed at the filament to be transmitted rapidly to the external gun housing.

The ability of the cathode insulator to act as a thermal conductor to remove heat to the external walls is due to both geometric considerations and material selection. The material selected is high grade aluminum oxide, $Al_2O_3$, which has thermal conductivity on the order of 20 watts per meter per degree kelvin——a conductivity which is as good or better than some metals. Other materials, for example beryllium oxide or silicon nitride, may also be used. The smaller diameter end of the ceramic insulator extends into the cylindrical cathode (the control electrode) holder, and the filament holders bolt directly onto the surface of the insulator, so that the heat from the filament holders can flow directly into the insulator. The outer large diameter of the insulator is bonded directly to the gun housing using a high thermal conductivity epoxy. The ceramic can also be mounted by brazing it to the housing or mechanically clamping it. The filament posts [36] and cathode mounting bolts [37] which are supported by the insulator are hermetically sealed by means of O-rings [38] from the cable side to the cathode side of the insulator. The gun housing separates at a location that permits easy access to the cathode and filament assembly for cleaning and changing filaments and cathode electrodes. Quick release toggle latches are used to hold the gun housing together at the juncture so that fast, easy access for filament changes or for changing the cathode electrode or the anode may be realized. The main body of the electron gun housing is used to unify the various parts of the electron gun into the whole assembly. The cathode holder assembly, including insulator with cable, mounts and pilots onto the top of the gun body, while the focus coil lens pilots and mounts into the bottom with the deflection coil and an antenna [41] utilized in a beam position detection system. The anode mounts and pilots into the center of the housing along with the alignment coil [39] and column valve [10].

The column valve and its associated mounting plate seal the high-voltage electron gun area off from the rest of the gun. The high-voltage electron gun area is pumped by a turbomolecular pump [13] mounted to the flange provided on the gun housing. The pump is sufficiently large to evacuate the high-voltage gun area to better than $5 \times 10^{-6}$ torr when the chamber pressure is approximately $1 \times 10^{-4}$ torr. The addition of the turbomolecular pump will not only maintain a better vacuum in the high-voltage gun area, but permits activation of the gun at higher chamber pressures than would be possible without the pump. Normal gun activation pressure without the turbomolecular pump would be at $1 \times 10^{-4}$ torr in the chamber. With the addition of the turbomolecular pumped gun, activation is possible at chamber pressures at least five times higher. The use of the turbomolecular pump reduces the required high vacuum pumping time quite radically, especially with large chamber machines. The turbomolecular pump is mounted with its axis parallel to the normal gun tilt axis. The tilt axis is about the gun mounting point. This mounting arrangement maintains constant pump attitude regardless of gun tilt.

The column valve and the turbomolecular pump exhaust valve allow the turbo-molecular pump high-voltage area to be valved and sealed off during periods when the chamber is vented. By sealing off this critical high-voltage area and avoiding the associated exposure to dirt (blown around by venting) and moisture (condensed out when passing through the dew point during roughing), the electron beam gun will improve in operating stability and reliability without extensive high-voltage conditioning or "glow discharge" cleaning to void dirt and moisture. By separately pumping the high-voltage area and achieving a superior, repeatable vacuum, improved filament lifetimes are obtained and truly superior stability and reliability are achieved.

Both valves in the system are activated by electric motor drives so that in the open and in the closed position, the motors are off. The column valve [10] is a ball valve and the turbo exhaust valve [40] is a butterfly valve. Both valves are designed to stay in either the open or closed positions without external restraint. Limit switches are provided to detect both open and closed positions and, in addition, positive stops are provided with motor stall current detection to shut down the motors at the stops.

The drive motor [11] for the column valve mounts on a side access door. A special coupling allows the motor and door to be removed for access to the column valve or to the optics cavity. The optics cavity is space reserved in the electron beam gun body for an optional viewing system. The cavity also provides convenient access to remove and service the ball valve.

Water cooling lines brought to the electron beam gun to cool the turbo pump are also utilized to cool the cathode insulator heat sink. Other methods of cooling the insulator and associated parts would include direct cooling of the metal insulator housing and direct cooling by water contact of the ceramic insulator proper.

The invention is not to be limited to or by details of construction of the particular embodiment thereof illustrated by the drawings, as various other forms of the device will of course be apparent to those skilled in the art without departing from the spirit of the invention or the scope of the claims.

What we claim is:

1. In a machine for welding material by means of an electron beam comprising a vacuum chamber; means to evacuate the said chamber; means for generating an electron beam mounted within said vacuum chamber, including an anode and cathode and filament and their supporting means; means for moving the said electron beam generating means to cause said electron beam to be projected along a predetermined path on a workpiece; means to evacuate a desired volume within the said means for generating an electron beam; means to seal off the said volume from the atmosphere in said vacuum chamber; and means for focusing and deflecting the electron beam in its travel toward the workpiece. The said electron beam generator characterized in that the supporting means for the said cathode and filament comprises a hollow ceramic insulator of conical shape inside and out whose wall thickness increases as its outer diameter increases, and which is supported at its largest end by a cylindrical metal housing, the said end of said insulator shaped so that a passageway is formed between the said insulator and the said metal housing through which a liquid cooling medium may be circulated to remove heat which is developed, during operation of the electron beam generator, in the said parts supported by said insulator.

2. An electron beam welding machine as in claim 1, including flexible cable means for supplying current to the said movable electron beam generating means from a power supply outside the said vacuum chamber, the said cable means comprising a central conductor surrounded by two separate concentric conductors and concentric insulating means between each conductor and a surrounding concentric ground conductor, the said concentric ground conductor covered by a protective concentric insulating cover which is impervious to the passage of air.

3. A flexible cable means as in claim 2 having a plug at each end of said cable which includes three terminals connected to the said central conductor and the said two separate concentric conductors; and a means of fastening the said plug to a receptacle, the said fastening means being connected to the aforementioned ground conductor.

4. A flexible cable as in claim 3 having a plug at one end for insertion into a matching receptacle on the aforementioned electron beam generator, the said plug and receptacle being so dimensioned that a small clearance remains between a wall of the plug and a mating wall of the receptacle, which space is filled with a sealing grease; and a plug at the opposite end of said cable for insertion into a receptacle mounted on the wall of said vacuum chamber, the said plug for insertion into the electron beam generator including a quick release, spring loaded clamping mechanism which maintains a desired force on the said sealing grease.

5. An electron beam generator as in claim 4 including a receptacle for receiving a plug fitted to a cable designed to pass current from a power supply to said electron gun, the said receptacle including a conically shaped insulator fastened to the inner wall of said metal housing, the said metal housing being provided with a passageway leading from a space between the top of said insulator and the inner wall of said housing, to the outer surface of said housing so as to allow a grease placed between the said plug and said insulator to be released from said space through a check valve so as to maintain a predetermined pressure in the said grease while the plug is held in the receptacle by a preset spring force.

6. An electron beam generator as in claim 4 including an extension to the said metal housing which attaches to the said metal housing in a plane which passes approximately through the smaller end of the said insulator and which is attached to the said metal housing by quick release clamps, the said extension provided with supporting means for a turbo-molecular pump and a valve for sealing off, from the space outside the said electron beam generator, a space within the housing which is between the aforementioned anode and ceramic insulator.

* * * * *